United States Patent
Arghavani et al.

[11] Patent Number: 6,124,171
[45] Date of Patent: *Sep. 26, 2000

[54] METHOD OF FORMING GATE OXIDE HAVING DUAL THICKNESS BY OXIDATION PROCESS

[75] Inventors: Reza Arghavani, Aloha; Bruce Beattie, Portland; Robert S. Chau, Beaverton; Jack Kavalieros, Portland; Bob McFadden, Aloha, all of Oreg.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/160,556

[22] Filed: Sep. 24, 1998

[51] Int. Cl.⁷ .................................................. H01L 21/336
[52] U.S. Cl. .......................... 438/286; 438/263; 438/981
[58] Field of Search ..................... 438/165, 179, 438/263, 264, 286, 428, 431, 475, 971, 981; 257/326

[56] References Cited

U.S. PATENT DOCUMENTS

| | | |
|---|---|---|
| 3,719,866 | 3/1973 | Naber et al. ............................. 257/326 |
| 3,877,055 | 4/1975 | Fisher et al. ............................. 257/326 |
| 4,352,236 | 10/1982 | McCollum . |
| 4,611,308 | 9/1986 | Lonky ....................... 257/316 |
| 4,868,136 | 9/1989 | Ravaglia ................... 257/506 |
| 4,935,802 | 6/1990 | Noguchi et al. ........................ 257/316 |
| 4,962,065 | 10/1990 | Brown et al. ........................... 438/792 |
| 5,541,478 | 7/1996 | Troxell et al. .......................... 313/496 |
| 5,731,238 | 3/1998 | Cavins et al. .......................... 438/261 |
| 5,741,737 | 4/1998 | Kachelmeier .......................... 438/981 |
| 5,773,100 | 6/1998 | Chang et al. ........................... 427/579 |
| 5,780,893 | 7/1998 | Sugaya ..................... 257/318 |
| 5,792,705 | 8/1998 | Wang et al. ............................. 438/624 |
| 5,825,068 | 10/1998 | Yang ....................... 257/380 |
| 5,831,283 | 11/1998 | Batey et al. ............................. 257/380 |

*Primary Examiner*—Charles Bowers
*Assistant Examiner*—Jack Chen
*Attorney, Agent, or Firm*—Blakely, Sokoloff, Taylor & Zafman LLP

[57] ABSTRACT

Transistors are formed on the substrate having two different thickness' of gate oxides. A silicon nitride mask is used to protect one of the gate oxides while the other is grown. A nitride mask is formed from a hydrogen balanced nitride layer formed using direct plasma deposited nitride with an ammonia and silane chemistry. In one embodiment the nitride mask remains in place in the completed transistor.

5 Claims, 2 Drawing Sheets

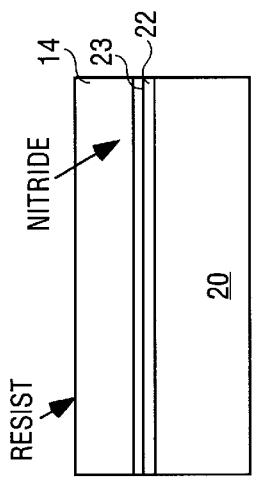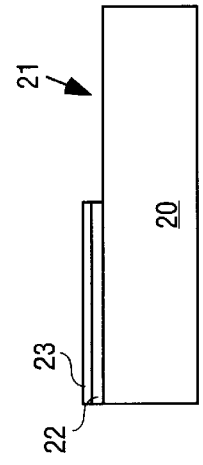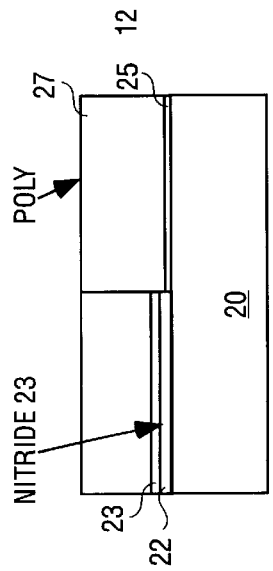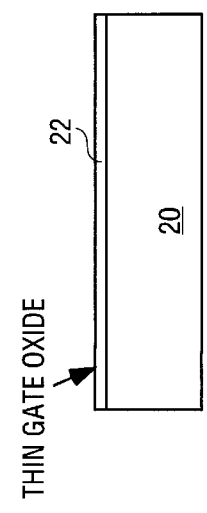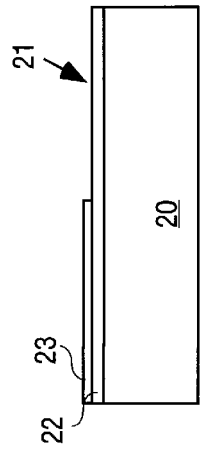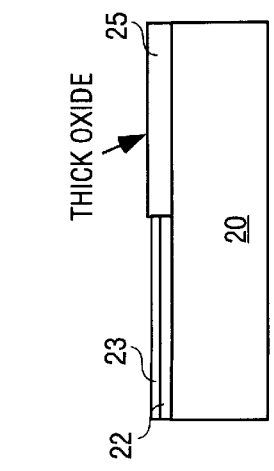

METHOD OF FORMING GATE OXIDE HAVING DUAL THICKNESS BY OXIDATION PROCESS

BACKGROUND OF THE INVENTION

1. Field of the Invention

The invention relates to the field of metal-oxide-semiconductor (MOS) field-effect transistors (FETs) and more particularly, to the gate oxide used in these transistors.

2. Prior Art

While the need for an integrated circuit which operates at two different power supply potentials has been recognized, its practical realization has been another matter. Such an integrated circuit would be useful to drive a bus at one potential while internally operating at another potential. This would permit, for instance, a new microprocessor to operate at a higher potential with older peripherals than the potential used internally for high speed logic circuits. There are numerous other applications where an integrated circuit operating at two potentials would be useful.

The problem in realizing such an integrated circuit is that it requires for efficient operation, two different gate oxide thickness'. No effective, commercially practical method has been found for providing these two different thickness' of oxides on the same substrate. While it is known that silicon nitride may be used to inhibit the growth of an oxide layer thus, for instance, permitting field oxides of different thickness' to be produced such as shown in U.S. Pat. No. 4,352,236, the silicon nitride layers have not been suitable for use with gate oxides. The silicon nitride typically has a high defect density preventing its use as an efficient insulator for the gate of field-effect transistors.

SUMMARY OF THE INVENTION

A process for forming a first and a second gate oxide layer of different thickness' on a substrate is disclosed. A first gate oxide layer is formed on the substrate to a first thickness. Following this a hydrogen balanced silicon nitride layer is formed on the first gate oxide layer. Now the silicon nitride layer is masked and the silicon nitride layer and underlying first gate oxide layer are etched to expose at least one area on the substrate. The second oxide layer is formed on the area of the substrate to a second thickness different than the first thickness.

BRIEF DESCRIPTION OF THE DRAWINGS

FIG. 7 is a cross sectional elevation view of a substrate with a first oxide layer formed thereon, this figure and FIGS. 8 through 12 are used to illustrate an alternate embodiment of the present invention.

FIG. 8 illustrates the substrate of FIG. 7 after a silicon nitride layer and photoresist layer have been formed on the substrate.

FIG. 9 illustrates the substrate of FIG. 8 after a masking and etching step.

FIG. 10 illustrates the substrate of FIG. 9 after an additional etching step.

FIG. 11 illustrates the substrate of FIG. 10 after a second oxide layer has been formed on the substrate.

FIG. 12 illustrates the substrate of FIG. 11 after a polysilicon layer has been formed on the substrate.

DETAILED DESCRIPTION OF THE PRESENT INVENTION

A method for forming two different thicknesses of gate oxides is disclosed. In the following description numerous specific details are set forth, such as specific flow rates and thickness' in order to provide a thorough understanding of the present invention. It will be appreciated that the present invention may be practiced without these specific details. In other instances well-known steps, such as cleaning steps, are not described in detail in order not to obscure the present invention.

Figure 1:
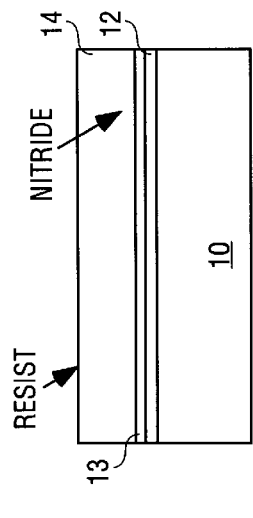
FIG. 1 is a cross sectional elevation view of a substrate having a first oxide layer formed thereon.

Referring now to FIG. 1, the monocrystaline silicon substrate 10 is first cleaned in a well-known manner using, for instance, a sacrificial oxide layer (e.g., silicon dioxide layer) and for instance, hydrofluoric acid. Then a first gate oxide 12 is formed on the substrate. This oxide may be formed with any one of a number of well-known steps and in one embodiment is thermally grown to a thickness of approximately 32 Å.

Next a silicon nitride layer 13 is formed on the oxide layer 12. This silicon nitride layer is deposited with a stoichiometry to match that of the underlying oxide layer 12 with minimal density of interface states. This hydrogen balanced silicon nitride layer 13 in the currently preferred embodiment is formed using plasma enhanced chemical vapor deposition (PECVD) as will be described.

In one embodiment to form the silicon nitride layer 13 a wafer is placed in a chamber of a commercial reactor such as an Applied Materials Precision 5000 reactor. In a nitrogen atmosphere with a nitrogen flow of 900 scc, the temperature is ramped to 275° C. (e.g., in 5 seconds). Then the wafer is stabilized in the chamber for about 30 seconds at this temperature with the additional gases of silane (6 scc) and ammonia (60 scc) flowing with the 900 scc of nitrogen. Now, the deposition occurs for approximately 3.4 seconds with radio frequency (RF) power at approximately 50 watts. The resultant direct plasma deposited silicon nitride of approximately 10–15 Å has the desired correct silicon nitride stoichiometry. This hydrogen balanced silicon nitride has very low stress at the interface with the oxide layer. This is important since in addition to reducing defects which affect its insulative properties, the silicon nitride is less likely to become distorted in subsequent high temperature steps.

The PECVD deposited silicon nitride layer discussed above has been examined with spectrometer analysis techniques. After studying this layer as well as others, it has been found that too little hydrogen in the silicon nitride as well as too much hydrogen in the silicon nitride causes defects, mainly traps. The best balance of hydrogen has been found to be approximately 30% (atomic percentage) hydrogen in the silicon nitride (range of 20% to 40% may be acceptable in some applications). With approximately 30% hydrogen the silicon nitride's defects are low enough to permit the silicon nitride to be used as a gate insulator.

Figure 2:
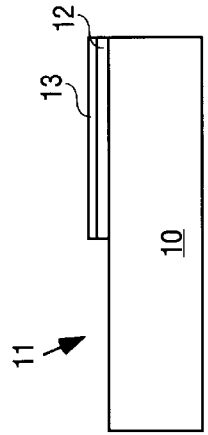
FIG. 2 illustrates the substrate of FIG. 1 after the formation of a silicon nitride layer and a photoresist layer.
Figure 3:
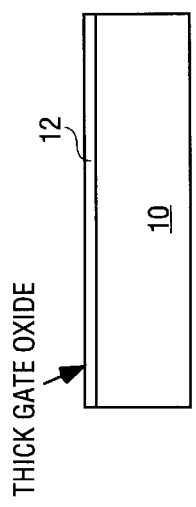
FIG. 3 illustrates the substrate of FIG. 2 after a masking and etching step.
Figure 4:
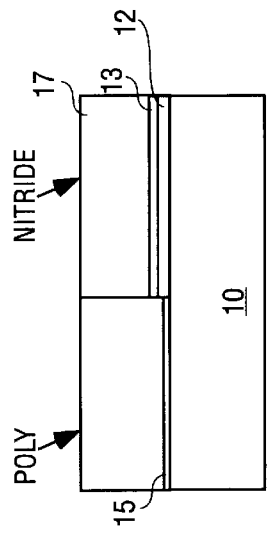
FIG. 4 illustrates the substrate of FIG. 3 after an additional etching step.

Now as shown in FIG. 2, a photoresist layer 14 is formed over the silicon nitride layer 13. The layer 14 is masked using ordinary lithographic techniques and the underlying silicon nitride layer 13 is etched in alignment with the layer 14 using either a wet or a dry etching step. As shown in FIG. 3 certain areas 11 of the substrate 10 have the oxide layer 12 exposed while other areas of the layer 12 remain covered by the overlying silicon nitride layer 13. The areas 11 are those areas of the substrate which are to receive the second gate oxide layer. The layer 12 is now etched in alignment with the remaining portions of the silicon nitride layer 13 exposing the substrate at the areas 11 as shown in FIG. 4. This may be done in a wet etchant using hydrofluoric acid and ammonia in water.

Figure 5:
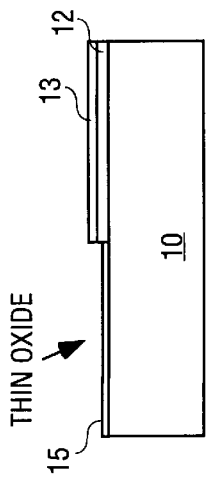
FIG. 5 illustrates the substrate of FIG. 4 after a second oxide layer has been formed on the substrate.

The substrate is now cleaned using well-known cleaning steps and then the second oxide layer 15 is grown as shown in FIG. 5. The second oxide layer may, for instance, be formed in the same manner as the first oxide layer in a vertical diffusion furnace. In one embodiment the second layer is grown to a thickness of approximately 20 Å. That is, the second layer is thinner that the first oxide layer.

Next, the gate oxide layers are annealed first in an atmosphere of ammonia for approximately 30 seconds at a temperature of approximately 905° C. followed by annealing in a nitrogen atmosphere for 60 seconds at a temperature of approximately 1080° C.

Figure 6:
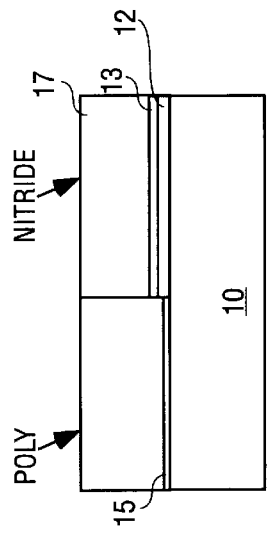
FIG. 6 illustrates the substrate of FIG. 5 after a polysilicon layer has been formed on the substrate.

Now, as shown in FIG. 6, a polycrystalline silicon (polysilicon) layer 17 of, for instance 3500 Å thick is formed over the substrate. In one embodiment this layer is planarized using chemical-mechanical polishing (CMP) to an average thickness of 2500 Å. This polysilicon layer is masked and etched to form gates. Some of the gates are separated from the substrate by the thicker, first oxide 12 and other gates are separated from the substrate by the thinner, second oxide layer 15. The subsequently formed transistors, for instance, operate at a voltage of 1.8V for those transistors having the thicker gate oxide and a voltage of 1.3V for those transistors having the thinner gate oxide.

In some embodiments, it may be desirable to remove the silicon nitride layer 13 after the etching of the first oxide layer 12, for instance, following the step shown in FIG. 4 and before the growing of the second oxide layer 15 of FIG. 5. When this is done, the first oxide layer 12 grows slightly when the second oxide layer 15 is grown. For example, the layer 12 may grow approximately 2 Å while the oxide layer 15 is grown to a thickness of approximately 20 Å.

In the alternate embodiment shown beginning with FIG. 7 a monocrystaline substrate 20, similar to the substrate 10 of FIG. 1, is illustrated. Instead of a thicker oxide first being formed on the substrate, in this embodiment a thinner oxide 22 is first formed. Again this oxide may be a thermally grown oxide and formed to a thickness of, for instance, 20 Å.

Next, as shown in FIG. 8, a silicon nitride layer 23 is formed on the layer 22. This layer may be formed as described above and again is a hydrogen balanced nitride layer. A photoresist layer 24 is then formed on the silicon nitride layer 23 and is masked. After the silicon nitride layer is etched and the resist is removed the structure that results is shown in FIG. 9. Also as shown in FIG. 10 the oxide layer 22 is etched at the areas 21 exposing the substrate.

Now unlike the previous embodiment, the thicker oxide layer 25 is formed on the substrate such as with a thermal oxidation step. This oxide layer may, for example, be grown to a thickness of approximately 32 Å.

Following the formation of the second, thicker oxide layer, gate oxide annealing occurs as described above and a layer of polysilicon again, for instance, 3500 Å thick is formed on the substrate. After the polysilicon layer is polished, it is masked and etched to form gates which subsequently become part of field-effect transistors. Once again, some of the transistors will have gate oxides formed from layer 25 while others will have gate oxides formed from the thinner layer 22.

Thus, a process has been described for forming a dual thickness gate oxide layers which at least in one embodiment incorporate an internal silicon nitride mask.

We claim:

1. A process for forming a first and a second gate oxide layer of different thickness on a substrate comprising:

forming the first gate oxide layer on the substrate having a first thickness;

forming a hydrogen balanced silicon nitride layer on the first gate oxide layer;

masking and etching the hydrogen balanced silicon nitride layer and the first gate oxide layer to expose at least one area on a surface of the substrate;

growing the second gate oxide layer on the area of the exposed substrate to a second thickness different from the first thickness;

annealing the first gate oxide layer and second gate oxide layer at a temperature above 1000° C.; and forming a layer of polysilicon over the substrate, including over the hydrogen balanced silicon nitride layer.

2. The process defined by claim 1 wherein the first gate oxide layer is thicker than the second gate oxide layer.

3. The process defined by claim 1 wherein the first gate oxide layer is thinner than the second gate oxide layer.

4. The process defined by claim 1 wherein the layer of silicon nitride has approximately 30% hydrogen atoms in the layer.

5. A process for forming a first and a second gate oxide layer of different thickness on a substrate comprising:

forming the first gate oxide layer on the substrate having a first thickness;

forming a silicon nitride layer by plasma enhanced chemical vapor deposition on the first gate oxide layer having an atomic percentage of hydrogen of approximately 30%;

masking and etching the silicon nitride layer and the first gate oxide layer to expose at least one area on a surface of the substrate;

growing the second gate oxide layer on the area of the substrate to a second thickness different from the first thickness;

annealing the first gate oxide layer and second gate oxide layer at a temperature above 1000°C.; and forming a layer of polysilicon over the substrate including over the silicon nitride layer.

* * * * *